United States Patent [19]

Beasley et al.

[11] Patent Number: 5,047,385
[45] Date of Patent: Sep. 10, 1991

[54] METHOD OF FORMING SUPERCONDUCTING $YBA_2CU_3O_{7-x}$ THIN FILMS WITH CONTROLLED CRYSTAL ORIENTATION

[75] Inventors: Malcolm R. Beasley, Palo Alto, Calif.; Kookrin Char, Seoul, Rep. of Korea; Theodore H. Geballe, Woodside; Robert H. Hammond, Los Altos, Calif.; Aharon Kapitulnik, Palo Alto, Calif.; Andy Kent, Chene, Switzerland; Michio Naito, Tokyo, Japan; Byungdu Oh, Seoul, Rep. of Korea

[73] Assignee: The Board of Trustees of the Leland Stanford Junior University, Stanford, Calif.

[21] Appl. No.: 221,726

[22] Filed: Jul. 20, 1988

[51] Int. Cl.$^5$ .................... C23C 14/34; B05D 3/06; B05D 5/12

[52] U.S. Cl. ......................... 505/1; 505/731; 505/742; 505/730; 204/192.24; 427/62; 427/53.1; 427/38

[58] Field of Search ............. 204/192.24, 298.01; 427/62, 63, 53.1, 38; 505/1, 731, 742, 730

[56] References Cited

U.S. PATENT DOCUMENTS

| | | | |
|---|---|---|---|
| 4,219,608 | 8/1980 | Nishiyama et al. | 428/411 |
| 4,229,506 | 10/1980 | Nishiyama et al. | 428/539 |
| 4,316,785 | 2/1982 | Suzuki et al. | 204/192 S |
| 4,572,842 | 2/1986 | Dietrich et al. | 427/39 |
| 4,588,942 | 5/1986 | Kitahara | 204/298 MT |

FOREIGN PATENT DOCUMENTS 61-168530 7/1986 Japan .

OTHER PUBLICATIONS

Evetts et al., "Structural Stability and Kinetic Processes in YBaCuO Thin Films and Device Structures", High Temperature Superconductors, Apr. 23-24, 1987, MRS Symposium, pp. 227-229.
Somekh et al., "High Superconducting Transition Temperatures in Sputter-Deposited YBaCuO Thin Films", Nature, vol. 326, Apr. 1987, pp. 857-859.
Hor et al., "Superconductivity Above 90K in the Square-Planar Compound System $ABa_2Cu_3O_{6+x}$ With A=Y, La, Nd, Sm, Eu, Gd, Ho, Er, and Lu", Phys. Rev. Lett., vol. 58(18), May 1987, pp. 1891-1894.
Aizaki et al., "$YBa_2Cu_3O_y$ Superconducting Thin Film Obtained by Laser Annealing", Jpn. J. Appl. Phys., 27(2), Feb. 1988, L 231-233.
Evetts et al., "Structural Stability and Kinetic Processes in YBaCuO Thin Films and Device Structure", MRS, Apr. 1988 (Nevada), pp. 227-229.
Shibata et al., "C-Axis-Oriented Superconducting Oxide Film by the Sol-Gel Method", Jpn. J. Appl. Phys., 27(4), Apr. 1988, L 646-648.
Itozaki et al., "High Tc and Jc Superconducting Thin Films Prepared by Sputtering", MRS, Apr. 1988 (Reno, Nevada), pp. 205-208.
Akoh et al. "Thickness Dependence of Superconductivity in Rf-Sputtered Y-Ba-Cu-O Thin Films", Appl. Phys. Lett., 52(20), May 1988, pp. 1732-1734.
Silver et al., "Sputter Deposition of $YBa_2Cu_3O_{7-y}$ Thin Films", Appl. Phys. Lett., 51(25), Dec. 1987, pp. 2149-2151.
"Thin-Film Synthesis of the High-$T_c$ Oxide Superconductor $YBa_2Cu_3O_7$ by Electron-Beam Codeposition", M. Naito et al., J. Mater. Res., 2(6), Nov./Dec. 1987, pp. 713-725.
"Reactive Magnetron Sputtering of Thin-Film Superconductor $YBa_2Cu_3O_{7-x}$", K. Char et al., Appl. Phys. Lett., 51(17), Oct. 26, 1987, pp. 1370-1372.

Primary Examiner—Norman Morgenstern
Assistant Examiner—Roy V. King
Attorney, Agent, or Firm—Flehr, Hohbach, Test, Albritton & Herbert

[57] ABSTRACT

A method of forming a superconducting $YBa_2Cu_3O_{7-x}$ thin film with selected crystal orientation is described which comprises the steps of sputtering simultaneously Y, Ba and Cu onto the surface of a substrate, introducing oxygen at said surface during deposition, controlling the stoichiometry of the elements Y, Ba or both richer or poorer than the 1:2:3 stoichiometry within a few atom percent and followed by annealing to selectively grow an a-axis or a c-axis oriented film of $YBa_2Cu_3O_{7-x}$.

12 Claims, 1 Drawing Sheet

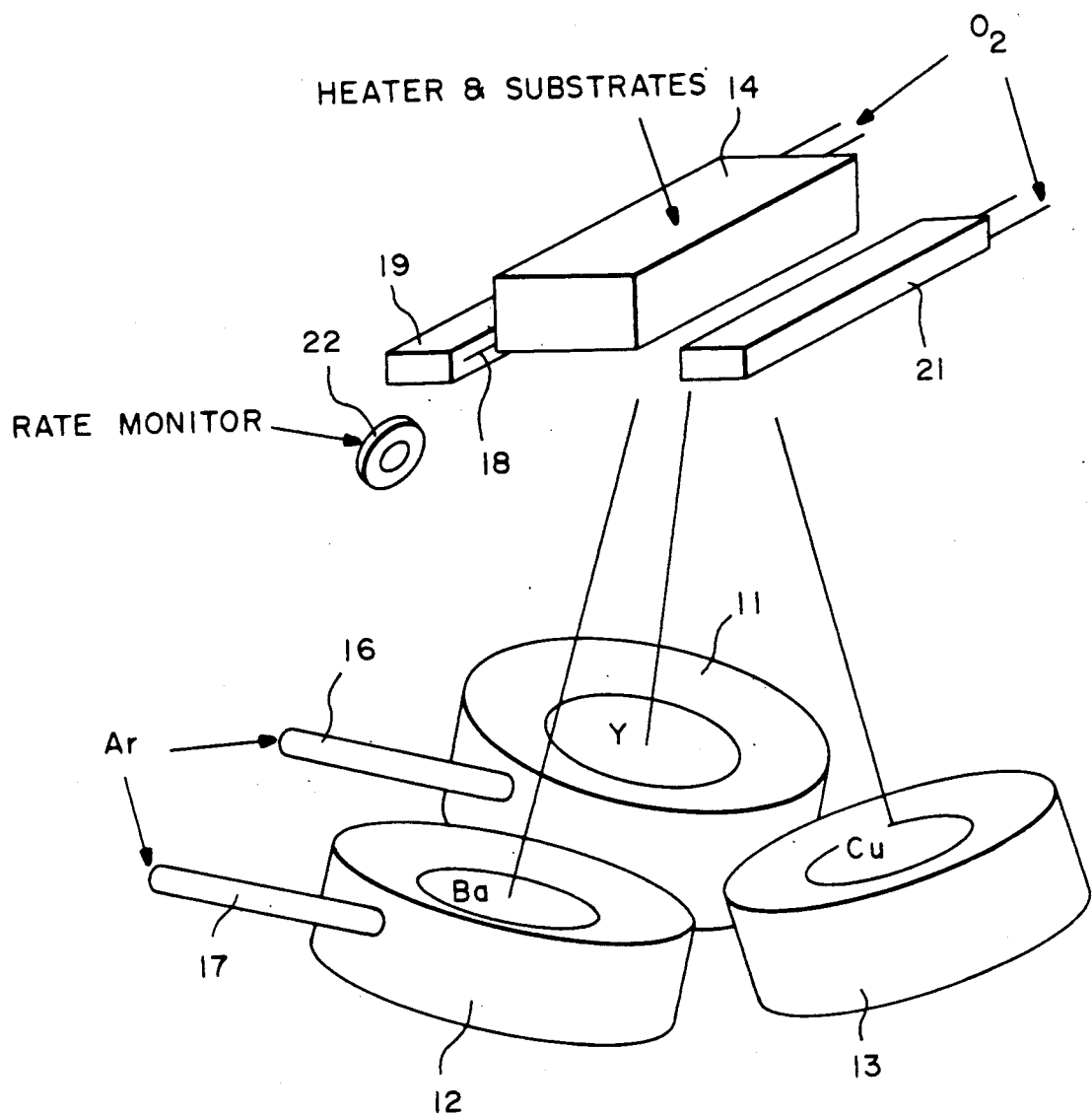
FIG.—1
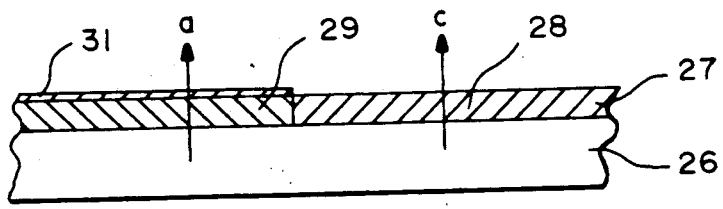
FIG.—2
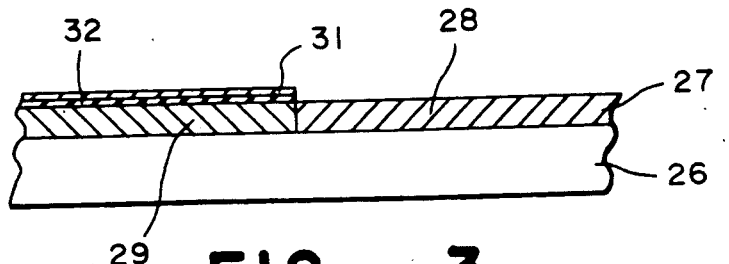
FIG.—3

METHOD OF FORMING SUPERCONDUCTING $YBA_2CU_3O_{7-x}$ THIN FILMS WITH CONTROLLED CRYSTAL ORIENTATION

This invention relates generally to the deposition of thin films of $YBa_2Cu_3O_{7-x}$ with controlled crystal orientation and to devices formed with such films The recent discovery of superconducting materials with transition temperatures in the region of 90° K. has made possible a wide range of new or improved electronic devices. Many of these devices will be fabricated in thin films of superconducting material Electron beam evaporation, magnetron sputtering, molecular beam epitaxy and pulsed laser evaporation techniques have been employed to produce thin films of superconducting materials with sharp transitions, high critical currents and high values of critical fields.

$YBa_2Cu_3O_{7-x}$ is a preferred compound for growth on $SrTiO_3$ substrates which have lattice parameters very similar to those of the superconductor material.

The principal reference directions in the $YBa_2Cu_3O_{7-x}$ crystal structure forming a film are the a-, b- and c-axis, all mutually perpendicular to one another with the c-axis the direction of the elongated axis of the crystalline structure and perpendicular to the conducting direction.

When a film is said to have a-axis texture it means that the majority of grains are oriented with their a-axis perpendicular to the plane of the film. When grown on {100} $SrTiO_3$ substrates, thin films have generally contained mixtures of a-, b- and c-axis textures.

It is an object of the present invention to provide a method of producing thin films which are selectively of either a-, b- or c-axis orientation.

It is another object of the present invention to provide a process for preparing thin films whereby one can controllably deposit the films primarily either a-, b- or c-axis.

It is another object of the present invention to provide a thin film process which will form films suitable for devices that will utilize the unique aspects of the crystal orientation and to devices formed with said films.

It is a further object of the present invention to provide a method of forming multi-layer thin film devices with each layer having selected crystal orientation.

The foregoing and other objects of the invention are achieved by growing a thin film of nominally $YBa_2Cu_3O_{7-x}$ composition by depositing material on the surface of a substrate from sources of Y, Ba and Cu with oxygen present at the surface of the substrate and selectively controlling one or more, the thickness, composition or annealing temperatures and time.

The invention will be more clearly understood from the accompanying drawings read in conjunction with the corresponding description.

Referring to the drawings:

FIG. 1 schematically shows apparatus for carrying out the method of the present invention.

FIG. 2 is a sectional view of a film grown in accordance with the invention

FIG. 3 shows a junction device formed with the film of FIG. 2.

One method of forming thin films of superconductor material with selected crystal orientation in accordance with the present invention is melting Yttrium (Y), Barium (Ba) and Copper (Cu) metals to form bulk material, machining the material into targets of 5 cm diameter and 4 mm thickness and mounting the targets in three magnetron sputtering guns. Referring to FIG. 1, three sputtering guns 11, 12 and 13 with the mounted targets are set up in triangular arrangement and angled in such a way that they are pointed toward the center of a substrate holder 14. The composition of deposited material is controlled by controlling the sputtering rate of each sputtering gun and by placement of the substrate on the substrate holder relative to the sputtering guns. By positioning the substrate on the holder, the copper content and the Y/Ba ratio can be controlled In one example, 6 mm by 6 mm substrates were placed in three rows on the substrate holder The composition spread from the first substrate to the seventh substrate on the copper richest row was from $Y_{15}Ba_{35}Cu_{50}$ to $Y_{19}Ba_{28}Cu_{53}$. The composition spread on the middle row was from $Y_{15}Ba_{37}Cu_{48}$ to $Y_{19}Ba_{30}Cu_{51}$ and the composition spread on the copper poorest row was from $Y_{15}Ba_{39}Cu_{46}$ to $Y_{19}Ba_{32}Cu_{49}$. This means that the composition variation in a single substrate is about 0.5 atom percent.

The sputtering guns are in a vacuum enclosure with the base pressure of the vacuum system at $1 \times 10^{-6}$ torr. Ar gas at $2 \times 10^{-3}$ torr pressure is introduced to the Ba and Y sources at 16 and 17 in order to keep them from oxidizing. Oxygen is introduced near the substrate by injecting it through a thin slit 18 in the manifolds 19 and 21 toward the substrate to produce a homogeneous gas distribution at the growing film surface. In this way there is a high oxygen impingement rate at the substrate surface while there was a relatively low partial pressure of oxygen, $1 \times 10^{-4}$ torr, in the vacuum system. With this arrangement of gas flow, the sputtering sources, especially Ba and Y, are not oxidized and a uniform and stable deposition rate is maintained.

Before the $SrTiO_3$ substrates are mounted in the holder they are cleaned with solvent, degreased and then heated to 800° C. and cooled down in an oxygen atmosphere while inside the chamber just before deposition. Ambient temperature is used for the substrate temperature. Ba is sputtered by rf power and dc sputtering is used for the Y and Cu. In order to clean off the oxide surface of Ba target, the target is presputtered until the plasma turns bright green. The sputtering rate of each gun is measured individually prior to deposition, by a quartz crystal monitor 22 placed below the gas inlet system. After the rate from each source is set, the total rate with all sources operating and oxygen flow is checked to insure the stable operation of all the sources. Under these conditions the rate of deposit is 3 to 4 Å per second.

It is well known that the composition of a film is the most important factor in obtaining a good quality superconducting film. $YBa_2Cu_3O_{7-x}$ is a line compound and any deviation from the stoichiometry will introduce secondary phases, all either semiconducting or insulating. Also it has been shown that $YBa_2Cu_3O_{7-x}$ grows epitaxially on $SrTiO_3$ {100} substrates. As far as the lattice constant match is concerned, a-axis oriented film (a-axis perpendicular to the substrate) is preferable. However, $YBa_2Cu_3O_7$-x also tends to grow layer-by-layer with c-axis direction.

We have found that there is a close correlation between the composition of the film and its orientation. The most important metal in the composition is Cu. When Cu is a little richer than the stoichiometry $YBa_2Cu_3O_{7-x}$, the epitaxially grown films tend to orient in a-axis direction. On the other hand, when Cu is a little poorer than the stoichiometry, epitaxially grown films have a tendency to be c-axis oriented. As far as Y/Ba ratio is concerned, Y richer composition tend to be a-axis oriented, whereas Y poorer composition tend to orient in c-axis orientation. This means that slightly Cu rich and Y rich films are most likely to be a-axis oriented and slightly Cu poor and Ba rich films prefer to be c-axis oriented The composition difference here is 1 or 2 atom percent.

Films as deposited are basically various amorphous-like oxides according to the X-ray diffraction data. Subsequently they have usually been annealed for 3 hours at 650° C. followed by 1 hour at 750° C. and 1 hour at 850° C. Our experience shows that these annealing steps are enough for a-axis oriented films. When annealed more, they start to lose their a-axis orientation. On the other hand we found that more annealing, either by staying substantially longer at 850° C. or by going to higher temperature up to 880° C., makes c-axis oriented films more c-axis oriented Ba evaporates at the higher temperature annealing stage and if this temperature is maintained for a long time the composition moves closer to the 1:2:3 stoichiometry where the composition becomes more a-axis oriented. It has also been found that at the higher temperatures Sr and Ti from the $SrTiO_3$ diffuse into the film.

Orientation is also closely related to film thickness along with the composition and annealing conditions just described We found that a film of up to 4000 Å thickness can grow in the c-axis direction whereas thicker films always have a-axis peaks along with c-axis peaks in their X-ray data. This leads us to postulate that c-axis grains grow at the bottom part of the films and a-axis grains grow at the top part of the films.

The critical currents (Jc) in films with c-axis orientation are expected to be higher Jc for a-axis films is found to be $2 \times 10^6$ A/cm$^2$ (measured at 4.2K) while for c-axis films Jc is at least $1.2 \times 10^7$ (measured at 4.2° K.). The latter figure is significantly higher than that reported for any prior art superconducting material. The controlled preparation of c-axis films, independent of their use in a particular device, is a significant technological achievement. If other electronic characteristics scale, as expected, with the superior values of Jc, then the fabrication of high-frequency transmission lines and/or interconnects for use in integrated circuits should be possible A-axis films, on the other hand, while displaying lower critical currents, may be preferable in certain applications such as the formation of contacts or sandwich-type tunnel junctions.

In order to describe the use of the different thin film orientations in particular devices, it is important to understand something of the crystalline structure of $YBa_2Cu_3O_{7-x}$. It is thought that the conduction of electronic currents in the superconducting state occurs primarily if not exclusively along isolated planes of copper oxygen atoms which are oriented normal to the c-axis. Currents flowing in the plane of the film, but constrained to follow these copper-oxygen planes will have to follow tortuous "percolation" paths in polycrystalline films dominated by a-axis texture. In c-axis films, on the other hand, the copper-oxygen planes will form continuous sheets with no unfavorably oriented grains to impede current flow.

Furthermore, evidence has been presented to the effect that the $YBa_2Cu_3O_{7-x}$ superconducting energy gaps are anisotropic. One possible consequence of this is that shorted contacts or large-gap tunnel junction structures can not be formed on single crystalline material unless they were designed to allow currents to flow parallel to the copper-oxygen planes, i.e. perpendicular to the c-axis. It follows that if a wide planar contact material were applied over a film with mixed a and c-axis orientations, current would be injected preferentially through the a-axis grains. This simplifies the isolation of transmissions lines with c-axis orientation and allows for efficient contacts or tunnel junctions in selected a-axis regions of the film. Finally, if it is found that supercurrents can flow in a direction parallel to the c-axis, but with much reduced Jc (because of a smaller energy gap). It should be possible to design devices that exploit this characteristic as a source of non-linear kinetic inductance.

Given a thin film of uniformly c-axis texture, it is possible to re-anneal selected and well-defined regions of the film with a shuttered and addressable laser beam or other directed-energy device. The laser-irradiated regions are thereby caused to undergo heat treatments of such time and temperature that they are switched into the a-axis orientation. These regions would then be utilized effectively and exclusively for either resistance-less contacts or tunnel junctions with associated Josephson behaviors.

Given a thin film of uniformly a-axis texture, it is possible to perform ion-implantation of Ba atoms to selected regions of the film, such that, on re-annealing, these Ba-rich regions will re-grow with c-axis orientations.

FIG. 2 shows a device including a substrate 26 with a superconducting film 27 formed with two regions, 28 c-axis, and 29 a-axis. A conductive connection 31 is made to the region 28 with good conduction perpendicular to the plane of the film. A connection to an adjacent circuit element is made through the region 28.

FIG. 3 shows a circuit including a Josephson junction. The junction is formed by forming a thin insulating layer 32 between the conductor 31 and the region 29.

Thus, there have been provided methods of forming thin films of superconducting material with controlled crystal orientation.

What is claimed:

1. The method of growing a thin film of nominally $YBa_2Cu_3O_{7-x}$ composition with selected crystal orientation which comprises the steps of depositing material by sputtering simultaneously from Y, Ba and Cu sources on the surface of a substrate, introducing oxygen at said surface during deposition, controlling are richer or poorer than the 1:2:3 stoichiometry within a few atom percent and followed by annealing to selectively grow an a-axis or a c-axis oriented film of $YBa_2Cu_3O_{7-x}$.

2. The method of growing a thin film as in claim 1 wherein the thickness of the film is less than 4000 Å.

3. The method as in claim 1 in which Y, Ba or both are poorer than the 1:2:3 stoichiometry whereby to grow an a-axis films.

4. The method as in claim 3 including the additional steps of implanting Ba in selected regions of the grown a-axis film and annealing the film at elevated temperature to convert said implanted regions to c-axis.

5. The method as in claim 1 in which Y, Ba or both are richer than the 1:2:3 stoichiometry whereby to grow a c-axis film.

6. The method as in claim 5 including the additional step of annealing the grown film at 850° C. to improve the c-axis orientation.

7. The method as in claim 5 in which the thickness of the film is greater than about 4000 Å whereby the bottom layer of the film is c-axis and the top of the film is a-axis.

8. The method of growing a thin film as in claim 5 or 6 wherein excess barium is added to the composition.

9. The method of growing a thin film as in claim 1, 3 or 5 in which elements selected from the group consisting of La, Ce, Pr, Nd, Pm, $S_m$, Eu, Gd, Tb, Dy, Ho, $E_r$, Tm, Yb and Lu are substituted for Y.

10. The method of growing a film as in claim 1 in which selected regions of the grown film are heated with an energy beam to control crystal orientation.

11. The method as in claim 10 in which the beam of energy is a laser beam.

12. The method of growing a film as in claim 1, 2 or 8 in which ions are implanted in selected regions of the grown film to control crystal orientation.

* * * * *

UNITED STATES PATENT AND TRADEMARK OFFICE
CERTIFICATE OF CORRECTION

PATENT NO. : 5,047,385
DATED : September 10, 1991
INVENTOR(S) : Beasley, et al.

It is certified that error appears in the above-indentified patent and that said Letters Patent is hereby corrected as shown below:

At column 1, line 4, just below the title, insert --This invention was made with Government support under Contract No. F49620-83-C-0014 awarded by the Department of the Air Force and Contract No. N00014-83-K-0391 awarded by the Department of the Navy. The Government has certain rights in this invention.--

Signed and Sealed this

Second Day of May, 1995

Attest:

BRUCE LEHMAN

*Attesting Officer*  *Commissioner of Patents and Trademarks*